(12) United States Patent
Ueno

(10) Patent No.: US 6,294,444 B1
(45) Date of Patent: Sep. 25, 2001

(54) METHOD FOR MANUFACTURING SILICON CARBIDE SEMICONDUCTOR DEVICE

(75) Inventor: Katsunori Ueno, Kanagawa (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/359,362

(22) Filed: Jul. 21, 1999

(30) Foreign Application Priority Data

Jul. 21, 1998 (JP) .................................................. 10-204937

(51) Int. Cl.$^7$ ................................................. H01L 21/265
(52) U.S. Cl. ............................. 438/514; 438/518; 438/522
(58) Field of Search .................................. 438/510, 514, 438/522, 518, 530, 931, 795, 796, 799

(56) References Cited

U.S. PATENT DOCUMENTS

| | | | |
|---|---|---|---|
| 5,087,576 | * | 2/1992 | Edmond et al. ........................ 438/522 |
| 5,219,798 | * | 6/1993 | Kamakura ............................. 438/530 |
| 5,654,208 | * | 8/1997 | Harris et al. .......................... 438/931 |
| 6,030,848 | * | 2/2000 | Yuge et al. ............................ 438/796 |
| 6,054,352 | * | 4/2000 | Ueno .................................... 438/931 |
| 6,066,579 | * | 5/2000 | Matsushita et al. .................. 438/795 |

OTHER PUBLICATIONS

"Dopant Activation and Surface Morphology of Ion Implanted rH—abd 6H—Silicon Carbide"; M.A. Capano et al Journal of Electroni Materials, vol. 27, No. 4, 1998.
Al+and B+Implantations inot 6H—SiC Epilayers and Application to pn Junction Diodes; T. Kimoto et al. Journal for Electronic Materials, vol. 27, No. 4 1998.

* cited by examiner

*Primary Examiner*—Savitri Mulpuri
(74) *Attorney, Agent, or Firm*—Rossi & Associates

(57) ABSTRACT

In a method for manufacturing a silicon carbide semiconductor device, preliminary heat treatment is conducted after implanting impurity ions into a silicon carbide substrate, such that the silicon carbide substrate is heated at a temperature in a range of, for example, 800 to 1200° C., in a hydrogen atmosphere or a mixed gas ambient comprising hydrogen and inert gas. After the preliminary heat treatment, the silicon carbide substrate may be annealed at a high temperature.

18 Claims, 3 Drawing Sheets

METHOD FOR MANUFACTURING SILICON CARBIDE SEMICONDUCTOR DEVICE

FIELD OF THE INVENTION

The present invention relates to a method for manufacturing semiconductor devices using silicon carbide, and in particular to a heat treatment technology for activating impurities introduced into silicon carbide through ion implantation.

BACKGROUND OF THE INVENTION

Silicon carbide (hereinafter referred to as "SiC") has a wide band gap, and its maximum breakdown electric field is larger than that of silicon by one order of magnitude. Thus, SiC has been highly expected to be used as a material for power semiconductor devices in the next generation. Up to the present, single crystals, such as 6H—SiC and 4H—SiC, have been developed and manufactured with considerably high quality, and various types of semiconductor devices, including Schottky diodes, vertical MOSFET, and thyristors, have been fabricated, using SiC as a semiconductor material. It has been confirmed that these devices exhibit far better characteristics than conventional Si semiconductor devices.

SiC is known as growing an $SiO_2$ film on its surface to provide a desirable interface between a semiconductor substrate and an insulating film, by a thermal oxidation method similar to that employed for silicon. Since the $SiO_2$ film thus formed can be used as a gate insulating film or stabilizing film, SiC may be equally applied to MOS type semiconductor devices. The above property, i.e., formation of $SiO_2$ film, is peculiar to SiC, and cannot be observed in other compound semiconductor materials. Thus, MOS type semiconductor devices, such as MOSFET, can be easily manufactured utilizing this property, and SiC is expected to be used in a wide range of applications in the future.

The present invention is concerned with an ion implantation step that is essential to the manufacture of the above-indicated semiconductor devices. The ion implantation technique, which makes it easy to form regions having different impurity concentrations and conductivity types in a semiconductor crystal, is essential to the fabrication of semiconductor devices. The above-described SiC devices are also fabricated using the ion implantation technique.

In the case of SiC, for example, nitrogen or phosphorous is generally used for forming n type regions, and aluminum or boron is generally used for forming p type regions. After the ion implantation, the SiC substrate needs to be annealed or heat-treated at a high temperature for activation of the impurities thus implanted in the substrate. While the annealing temperature for silicon ranges from 900° C. to about 1250° C. at most, the annealing of SiC as heat treatment for activation may be carried out at a high temperature in the range of 1300° C. to 1700° C. since SiC is a thermally stable material even at a considerably high temperature.

FIG. 5 is a graph showing the relationship between the activation rate of implanted impurities and the annealing temperature as reported by Kimoto et al. (Refer to T, Kimoto, O. Takemura, H, Matsunami, T. Nakata, and M. Inoue; J. Electronic Materials, Vol. 27, No. 4, (1998) p. 358.) It will be understood from this graph that approximately 100% activation of impurities cannot be achieved unless the annealing temperature is 1500° C. or higher for aluminum, and 1700° C. or higher for boron.

It is known that such a high-temperature annealing, which is normally performed in an argon (Ar) gas, results in surface roughness due to vaporization of Si atoms on the SiC surface that makes the surface abundant in carbon (C). To avoid this phenomenon, it has been proposed to place the SiC wafer in a SiC container or in a graphite container alone with SiC powder during the high-temperature annealing, so as to produce a Si atmosphere and thus prevent vaporization of Si atoms. With this method, the SiC wafer is able to retain a mirror surface even with high-temperature annealing at about 1700° C.

It was, however, found from careful observation of the SiC surface after high-temperature annealing that a large number of minute defects or irregularities that lead to surface roughness take place even when employing the above method.

For example, the inventors observed the SiC surface that was subjected to high-temperature annealing at 1550° C. with a scanning electron microscope (hereinafter referred to as "SEM") after aluminum ions were implanted in the SiC surface, and found that striped surface roughness occurred in a direction perpendicular to <1, 1, −2, 0> direction. (Refer to Takashi Tsuji, Akira Saito, and Katsunori, Ueno; Extended Abstracts, The 45th Spring Meeting, 1998, The Japan Society of Applied Physics (30a-YF-1) p. 417). Although a number of minute defects or irregularities that lead to surface roughness are observed where only high-temperature heat treatment is conducted at 1550° C. without implanting ions into the surface, these defects are not as detrimental as those observed after ion implantation. The minute surface roughness appearing after high-temperature annealing is also reported by other researchers (as in M. A. Capano, S. Ryu, M. R. Melloch, J. A. Cooper, Jr., and M. R. Buss: J. Electronic Materials, Vol. 27, No. 4 (1998) p. 370), and it was found that the minute surface roughness becomes more apparent as the annealing temperature becomes higher or the amount of implanted ions increases. It is also known that spot-like defects occur in addition to the surface roughness.

The minute surface roughness is fatal or detrimental to semiconductor devices that utilize their surfaces in their operations. For example, the characteristics of Schottky diodes are greatly influenced by the conditions of the interface between metal and SiC. Also, the interface between an insulating film and SiC is most important to the operation of MOSFET, and it is thus essential to form a high-quality insulating film in the MOSFET.

FIG. 6 is a graph showing an insulating characteristic (denoted by "○") of an oxide film on SiC that was annealed at a high temperature of 1700° C. for 30 min. in Ar gas, after implanting boron ions into the SiC substrate. In the graph, the horizontal axis represents applied voltage, and the vertical axis represents leakage current. The oxide film was formed by a pyrogenic method in which hydrogen and oxygen were supplied. For comparison, FIG. 6 shows an insulating characteristic (denoted by ●) of an oxide film of SiC for which no implantation of boron ions nor high-temperature annealing was conducted. The thickness of the oxide film was 35 nm in each case.

The leakage current through the oxide film of SiC on which ion implantation and high-temperature annealing were performed is larger by one or two orders of magnitude than that of the oxide film of SiC on which ion implantation was not performed. Also, the oxide film of SiC subjected to no ion implantation broke down at 45 V or higher, whereas the oxide film of SiC subjected to ion implantation and high-temperature annealing broke down at about 25 V. It is thus understood that the insulating characteristic of the oxide film greatly deteriorates after ion implantation and high-temperature annealing. One of the reasons is that minute surface roughness appears on the SiC surface because of high-temperature annealing.

SUMMARY OF THE INVENTION

It is therefore an object of the present invention to provide a high-temperature annealing method that prevents minute surface roughness and enables formation of oxide films having desirable insulating characteristics, thereby to realize silicon carbide semiconductor devices having excellent characteristics.

To accomplish the above object, the present invention provides a method for manufacturing a silicon carbide semiconductor device, wherein preliminary heat treatment is conducted after implanting impurity ions into a silicon carbide substrate, which preliminary heat treatment comprises a step of heating the silicon carbide substrate in an atmosphere comprising hydrogen or a mixture of hydrogen and an inert gas. After the preliminary heat treatment, high-temperature annealing may be conducted.

By carrying out the preliminary heat treatment as described above, the resulting SiC surface hardly suffers from minute surface roughness as conventionally observed after heat treatment at about 1700° C., though its mechanism still remains unclear. Consequently, an oxide film having a high breakdown voltage or a high ability to withstand applied voltage can be formed on the SiC surface by thermal oxidation.

Where the atmosphere in which the preliminary heat treatment is conducted is a mixture of hydrogen and inert gas, the atmosphere preferably contains 20% or more of hydrogen.

The atmosphere for the preliminary heat treatment may further contain a hydrochloric acid gas, to provide a similar effect. The content of the hydrochloric acid gas is preferably controlled to be 5% or less of hydrogen. With the hydrochloric acid gas controlled to within this range, minute surface roughness on the SiC surface can be prevented, without causing etch-pits provided the content is not greater than 5%.

The preliminary heat treatment is preferably conducted at a temperature in a range of 800 to 1200° C. With the heating temperature controlled to within this range, minute surface roughness can be prevented or reduced. A noticeable effect cannot be observed if the temperature is less than 800° C., while etch-pits are formed if the temperature exceeds 1200° C.

If an annealing process is carried out at 1200° C. or higher in the same furnace immediately after the preliminary heat treatment, cooling and heating steps following the preliminary heat treatment are eliminated, thus simplifying the whole process, while avoiding introduction of plane defects during these steps.

It is also preferable to conduct prior heat treatment at a temperature in a range of 800 to 1200° C. before the preliminary heat treatment. The prior heat treatment makes it possible to remedy or cure crystal defects introduced due to ion implantation, and makes the SiC surface less likely to be etched. Thus, minute surface roughness caused by a gas capable of etching can be prevented.

The preliminary heat treatment is preferably conducted for at least five minutes. If it is less than five minutes, a noticeable effect of preventing minute surface roughness cannot be observed.

It is also important to remove an oxide film before the preliminary heat treatment. If the preliminary heat treatment is conducted while the oxide film remains on the SiC surface, pinholes, or the like, may be formed through the oxide film, thus causing non-uniform etching due to a gas capable of etching, and thereby making a rough surface. If the oxide film is present on a part of the SiC surface, the other part of the SiC may be unevenly or non-uniformly oxidized by oxygen emitted from the oxide film, and the surface may become roughened. If the preliminary heat treatment is conducted after removing the oxide film, the resulting surface maintains sufficient smoothness.

The silicon carbide semiconductor substrate may consist of a 4H—SiC or 6H—SiC crystal. High-quality 4H—SiC and 6H—SiC crystals are available, and may be suitably used for semiconductor devices. In particular, 4H—SiC crystal is most expected to be applied to power devices, since the mobility of carriers in the 4H—SiC crystal has least dependence on its crystal orientation, and is higher than those of other forms of SiC.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENT

Figure 1:
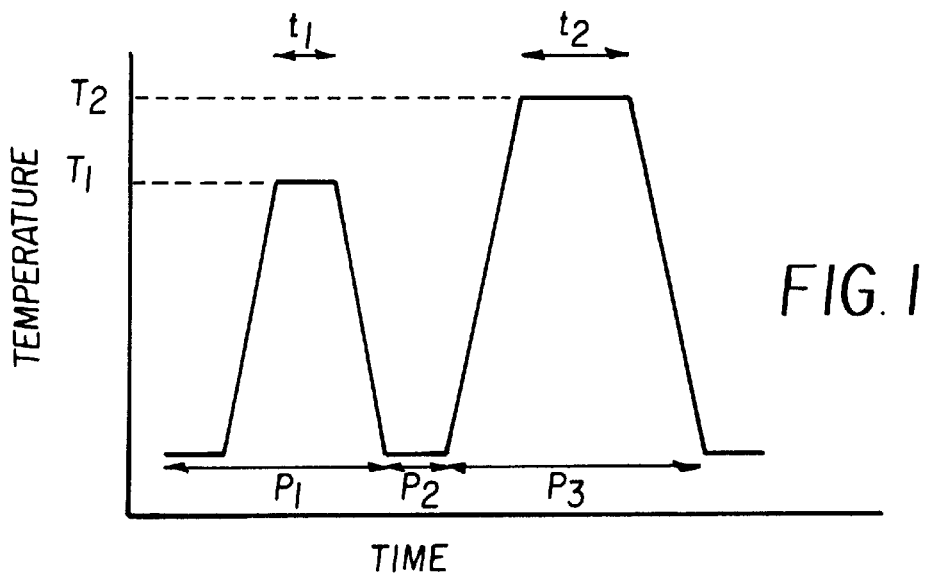
FIG. 1 is a diagram showing a temperature program of the first embodiment of the present invention.

The mechanism as to how the method provided by the present invention works is still unclear, but its effects or advantages became apparent from some experiments. By investigating the heat treatment method practiced before high-temperature annealing at about 1700° C. for activating impurities introduced through ion implantation, a method for preventing minute surface roughness during high-temperature annealing was developed. Referring to the drawings, the method of heat treatment on a silicon carbide semiconductor device according to the present invention will be described in detail.

First Embodiment

FIG. 1 is a diagram of a temperature program showing changes in the temperature during an oxidation step in the method of the present invention, wherein the horizontal axis represents time, and the vertical axis represents temperature.

In FIG. 1, a period of time denoted by "$P_1$" corresponds to a process step of conducting preliminary heat treatment of the present invention after ion implantation. In this step, the heat treatment is carried out in a furnace containing a hydrogen ($H_2$) atmosphere, unlike an annealing step that will be described later. In FIG. 1, "$T_1$" denotes the temperature of the preliminary heat treatment, and "$t_1$" denotes the time required for the preliminary heat treatment.

During a period of time "$P_2$" that follows "$P_1$", the specimen is placed outside of the furnace, and left at room temperature. In the next period of time "$P_3$", the specimen is introduced into an annealing furnace, heated to an annealing temperature "$T_2$", and annealed. The temperature at which the specimen is put into the furnace is generally in the range of 700° C. to 900° C., though this is not related to the principle of the present invention. In this step, the specimen is placed in a graphite container or SiC container, as described above. It is also preferable that the furnace be initially evacuated so as to remove oxygen or water vapor from within the furnace. The annealing is carried out in an inert atmosphere, such as an Ar atmosphere or nitrogen ($N_2$) atmosphere. The annealing time $t_2$ is generally set to several minutes to several hours, depending upon required annealing conditions.

After cooling in a suitable gas ambient under suitable cooling conditions, the specimen is taken out of the furnace, and cooled down to room temperature. The temperature at which the specimen is taken out of the furnace is generally in the range of 700° C. to 900° C., for reduction in the interface state density, though this range of temperature is not related to the principle of the present invention.

More specifically, the above operation is performed under the following conditions.

Initially, a SiC wafer is introduced into a preliminary heat-treatment furnace that is held at room temperature, and the atmosphere within the furnace is replaced by $H_2$ after evacuating it. The SiC wafer is then heated to 1000° C. ($T_1$), kept at this temperature for 30 min. ($t_1$) with 3 liters (L) of $H_2$ per minute flowing through the furnace, then cooled down to room temperature and taken out of the furnace.

In the next step, the SiC wafer is introduced into the annealing furnace at 700° C., and heated to 1700° C. ($T_2$). After the annealing is conducted in an Ar atmosphere for 30 min. ($t_2$), the specimen is cooled down to 700° C. in the same atmosphere at a rate of 3° C. per minute, and then taken out of the furnace.

Figure 2:
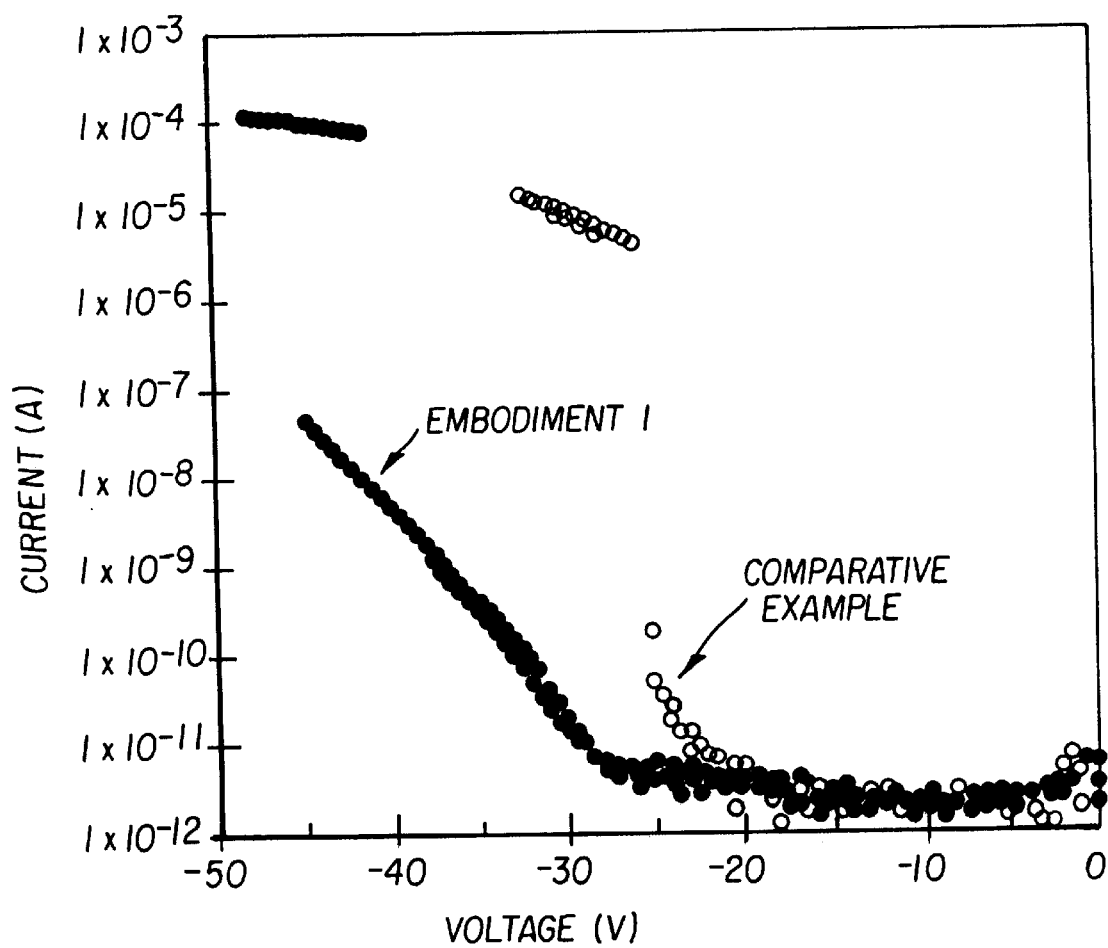
FIG. 2 is a graph showing insulating characteristics of an oxide film produced by the method of the first embodiment and that of a comparative example.

FIG. 2 is a graph showing an insulating characteristics of a thermal oxide film of SiC that was subjected to the preliminary heat treatment and annealing according to the present invention, wherein the horizontal axis denotes voltage applied to the thermal oxide film, and the vertical axis denotes leakage current. In the experiment, a 4H—SiC wafer that forms a silicon face having a crystal orientation of (0001) was used, and boron ions were implanted into the SiC wafer with an acceleration voltage of 100 keV and a dose amount of $5 \times 10^{13}$ cm$^{-2}$. After the ion implantation, the preliminary heat treatment and annealing as described above were conducted, and thermal oxidation was conducted by a pyrogenic method at 1100° C. for five hours. The thickness of the resulting oxide film was 35 nm. Here, high-frequency heating was performed in the preliminary heat-treatment furnace, and resistance heating was performed in the annealing furnace.

For comparison, FIG. 2 also shows the relationship between the applied voltage and the leakage current for the case where an SiC wafer was annealed and thermally oxidized without undergoing preliminary heat treatment after ion implantation. An electrode on the oxide film, which was formed by depositing aluminum by sputtering, had a diameter of 200 μm and a thickness of 0.2 μm.

The insulating characteristic of the thermal oxide film of SiC that was subjected to the preliminary heat treatment and annealing according to the method of the present embodiment shows that the leakage current rapidly increased from the point of around 28V, and reached about $1 \times 10^{-7}$ A at around 40V. The thermal oxide film broke down at a voltage in the range of 40 to 45V, and data points around $1 \times 10^{-4}$ A are those measured after the breakdown occurred.

For the thermal oxide film produced without conducting preliminary heat treatment, on the other hand, the leakage current rapidly increased from the point of around 20V, reached about $1 \times 10^{-10}$ A at around 25 V, and then broke down.

Figure 6:
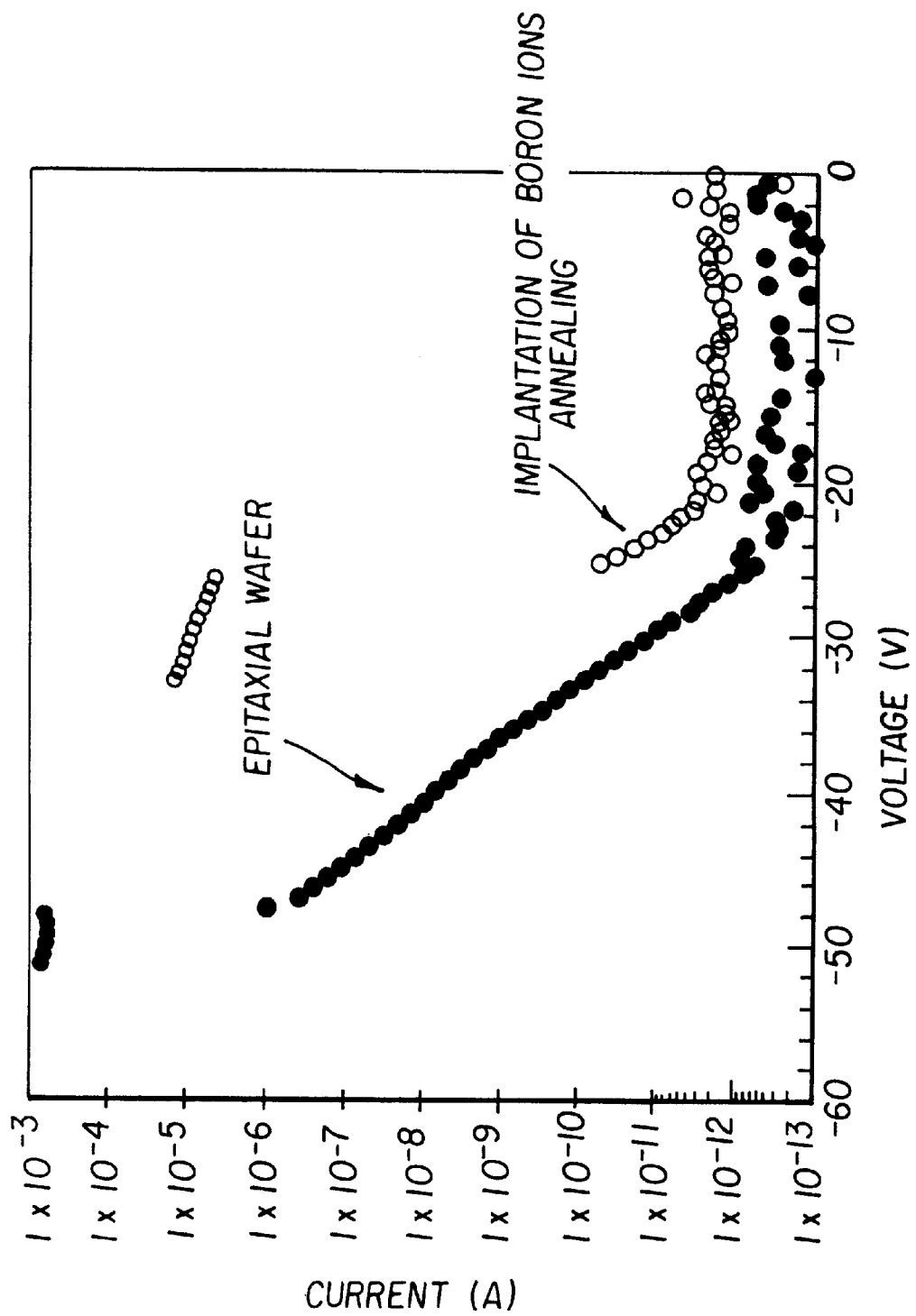
FIG. 6 is a graph showing insulating characteristics of thermal oxide films formed after high-temperature annealing.

As is understood from the above description, the thermal oxide film produced according to the method of the present invention has a greater insulating breakdown voltage, and is less likely to break down, thus providing substantially the same characteristic as in the case of FIG. 6 where no ion implantation nor annealing is conducted. It was also confirmed that the SiC surface after annealing is substantially free from minute striped surface roughness as observed in the known counterpart, and the method of the present invention was found to be considerably effective or advantageous when employed along with high-temperature annealing.

Although the mechanism that provides the above-described improvement has not been clarified, the preliminary heat treatment within the $H_2$ atmosphere may cause an incomplete layer of the surface to be etched, resulting in an improved insulating capability of the oxide film, as reported by H. Tsuchida et al., in Proceedings of International Conference on Silicon Carbide, III-nitrides and Related Materials-1997.

When some experiments were conducted by changing the temperature and time of preliminary heat treatment, it was revealed that the above effect was observed when the temperature $T_1$ was controlled to 800° C. or higher, but undesirable etch-pits appeared in the surface when the temperature $T_1$ exceeded 1200° C. The preliminary heat treatment yielded a desired effect when the treatment time $t_1$ was 5 min. or longer, and the better effect was obtained as the treatment time increased. However, the above effect tends to saturate if the treatment time becomes equal to or longer than two hours, and it is thus wasteful to increase the treatment time to be longer than two hours since it only results in an increase in the process time.

Second Embodiment

In the step of preliminary heat treatment executed before the annealing step, a mixture of $H_2$ and Ar gases containing 20% of $H_2$ was used as a gas ambient in the furnace, instead of $H_2$ as used in the first embodiment. The temperature and time of the preliminary heat treatment and the conditions of the following annealing step were the same as those of the first embodiment.

After the preliminary heat treatment and annealing steps, a thermal oxide film was formed by a pyrogenic method, and its insulating characteristic was evaluated. As a result of the evaluation, it was found that the thermal oxide film produced in the present embodiment exhibited substantially the same insulating characteristic as that of the first embodiment.

It is thus understood that the use of the mixed gas ambient of $H_2$ and Ar containing 20% of $H_2$ yielded almost the same effect as provided when using pure $H_2$. As an advantage, it is easier to handle such a mixed gas as an inert gas, as compared with pure $H_2$. It is, however, to be noted that the effect is significantly reduced if the mixed gas contains 10% or less of $H_2$. It is thus desirable that the content of $H_2$ be equal to or larger than 20%. Other than argon (Ar), helium or nitrogen may be used as inert gas.

Third Embodiment

In the step of preliminary heat treatment executed before the high-temperature annealing step, 1% of hydrochloric acid gas (HCl) was added to $H_2$. The temperature and time of the preliminary heat-treatment and the conditions of the following high-temperature annealing step were the same as those of the first embodiment.

After the preliminary heat treatment and annealing steps, a thermal oxide film was formed by a pyrogenic method, and its breakdown voltage, or capability to withstand voltage applied thereto, was measured. As a result of measurement on the insulating characteristic, the oxide film produced after the heat treatment according to the method of the present embodiment showed a slightly higher breakdown voltage than that of the first embodiment.

As a result of an experiment in which the HCl concentration was varied, it was found that etch pits appeared in the SiC surface when the HCl concentration exceeded 5%.

Fourth Embodiment

In the first method as shown in FIG. 1, after preliminary heat treatment is conducted following ion implantation, the SiC wafer is once taken out of the furnace, and then subjected to high-temperature annealing.

Figure 3:
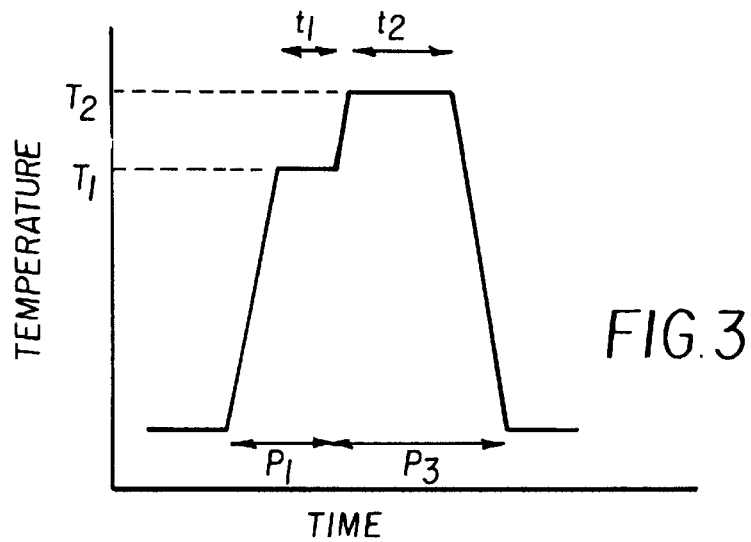
FIG. 3 is a diagram showing a temperature program of the fourth embodiment of the present invention.

FIG. 3 is a diagram of a temperature program showing changes in the temperature in another heat treatment method according to the fourth embodiment of the invention. In this method, the same furnace was used for both preliminary heat treatment and annealing, and these process steps were continuously or successively executed. This method will be now described in detail.

Initially, a SiC wafer is introduced into an oxidizing furnace at room temperature, and the atmosphere within the furnace is first evacuated and then replaced by $H_2$. The temperature of the furnace is then raised to 1000° C. ($T_1$), and kept at this temperature for 30 min. ($t_1$) with 3 liters of $H_2$ per minute flowing through the furnace. After the heat treatment, the atmosphere in the furnace is replaced by nitrogen, and then argon (Ar), and the temperature of the furnace is raised to 1700° C., and kept at this temperature fore 30 min. ($T_2$) so that the SiC wafer is annealed at such a high temperature. After the high-temperature annealing, the SiC wafer is cooled down to 700° C. ($T_2$) at a rate of 3° C. per minute, and taken out of the furnace.

The above-described method is advantageous in that another furnace need not be prepared for annealing, and the process can be simplified. The periods of time $P_1$, $P_3$ are to be interpreted in exactly the same way as those of FIG. 1, but the period of time $P_2$ is eliminated in FIG. 3.

An oxide film was formed after the heat treatment as described above, and its insulating characteristic was evaluated. As a result, the oxide film of the present embodiment showed substantially the same relationship between applied voltage and leakage current as that of the oxide film of the first embodiment as shown in FIG. 2.

Fifth Embodiment

Figure 4:
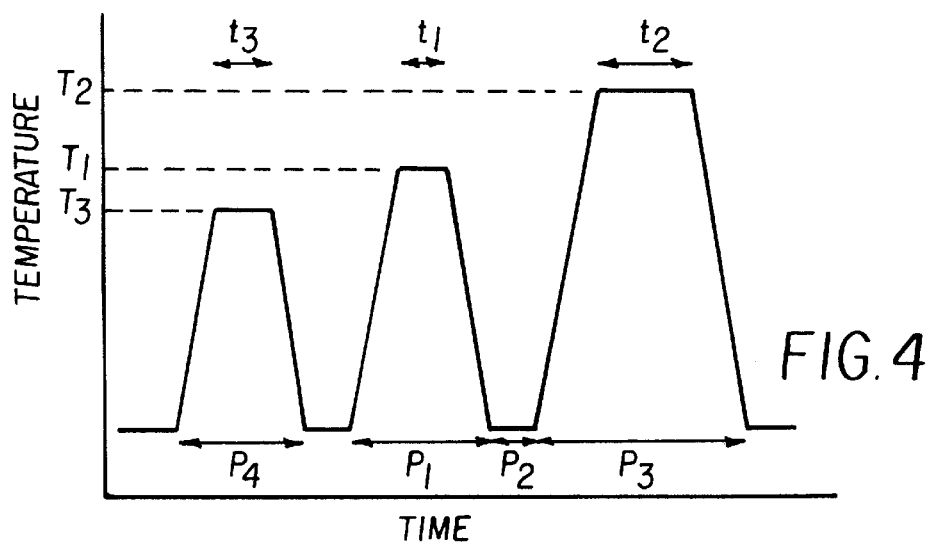
FIG. 4 is a diagram showing a temperature program of the fifth embodiment of the present invention.
Figure 5:
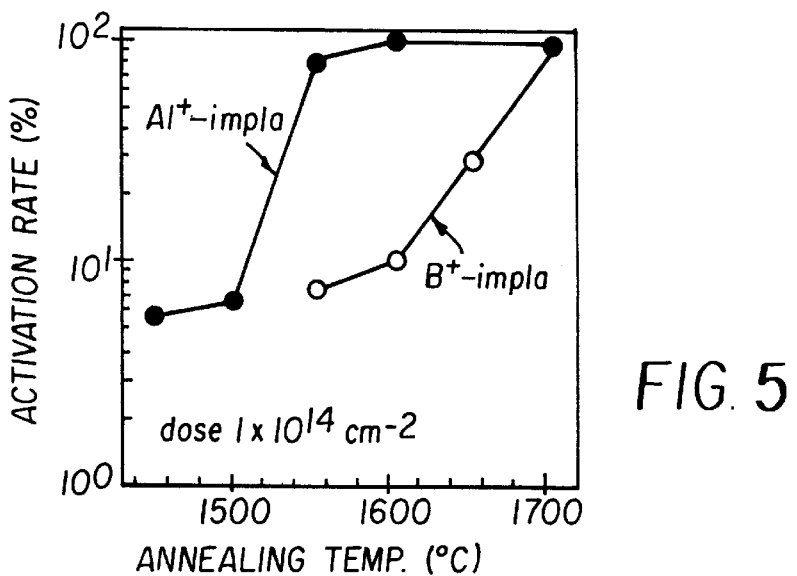
FIG. 5 is showing the dependence of the activation rate of impurities upon the temperature of annealing conducted after ion implantation.

FIG. 4 is a diagram of a temperature program showing changes in the temperature in another method of the present invention, which is characterized in that an additional step of $P_4$ is provided before the steps of $P_1$ to $P_3$ of FIG. 1.

In the methods of the previous embodiments, preliminary heat treatment is carried out in an atmosphere consisting of $H_2$, or mixture of $H_2$ and inert gas, or $H_2$ to which HCl is added. These atmospheres, however, have certain etching properties at high temperatures.

A SiC ion implantation layer, in which impurities ions have been forcibly implanted, suffers from numerous crystal defects, and is thus likely to be etched due to discontinuity or incompleteness in the crystal structure. It is therefore undesirable to expose the SiC layer to an atmosphere capable of etching immediately after the ion implantation.

In view of the above problem, it is desirable that prior heat treatment be conducting during the period of time $P_4$ at 1000 to 1300° C. in an inert atmosphere, so as to remedy the crystal defects to a certain extent, and then preliminary heat treatment be conducted in a gas ambient of $H_2$ or mixed gas of $H_2$ and inert gas.

In the prior heat treatment step $P_4$ of the above method, the SiC wafer is preferably placed in a container containing SiC, or the like, and heated in an inert atmosphere. This method is particularly advantageous in the case where a high energy was injected into or a large dose amount of impurities were implanted in the SiC wafer, causing increased damages due to the ion implantation.

In the illustrated embodiments, boron ions, for example, are implanted as impurity ions. To increase the activation rate of the implanted impurities, such as boron or aluminum, annealing needs to be conducted at a high temperature of 1500° C. or higher. It is, however, possible to use impurities, such as nitrogen ions, that are expected to activate to a certain extent even with 1200° C. or lower annealing, and, in this case, only the preliminary heat treatment of the present invention may be performed, without requiring high-temperature annealing.

While 4H—SiC crystal is used in the illustrated embodiments, the same effect may be obtained by using 6H—SiC crystal that is also alpha-phase SiC in which a zinc-blend structure and a wurtzite structure are superposed on each other in a different order from that of 4H—SiC crystal.

In addition, an oxide film may be etched due to heat treatment within $H_2$ or an $H_2$ ambient containing a small amount of HCl. Where an oxide film is present on the SiC surface after ion implantation, therefore, preliminary heat treatment is preferably conducted after removing the oxide film, so as to avoid non-uniform etching. Since the oxide film is fused during the following high-temperature annealing, it is preferable that the oxide film be removed prior to the high-temperature annealing.

As described above, according to the present invention, preliminary heat treatment is conducted after implanting impurity ions into a silicon carbide substrate, such that the silicon carbide is heated at a temperature in a range of, for example, 800 to 1200° C., in an atmosphere of $H_2$ or a mixture of $H_2$ and inert gas. Thereafter, high-temperature annealing is carried out, so as to reduce or prevent surface roughness that was conventionally observed after impurity ion implantation and annealing. Furthermore, an oxide film formed by thermal oxidation on the surface thus improved exhibits a significantly improved insulating property. A slight amount of HCl may be added to the atmosphere for the preliminary heat treatment.

In particular, the surface condition of the semiconductor substrate is considerably important to MOS type semiconductor devices, and the significant improvement in the surface conduction owing to the present invention greatly contributes to applications of silicon carbide to MOS type semiconductor devices.

What is claimed is:

1. A method for manufacturing a silicon carbide semiconductor device, comprising the steps of:

conducting preliminary heat treatment after implanting impurity ions into a silicon carbide substrate, said preliminary heat treatment comprising a step of heating the silicon carbide substrate in an atmosphere comprising hydrogen or a mixture of hydrogen and an inert gas at a temperature of at least 800° C.; and annealing the silicon carbide substrate at a temperature greater than the temperature of said preliminary heat treatment.

2. A method for manufacturing a silicon carbide semiconductor device according to claim 1, wherein the atmosphere comprising the mixture and hydrogen gas in which the preliminary heat treatment is conducted contains at least 20% of hydrogen.

3. A method for manufacturing a silicon carbide semiconductor device according to claim 1, wherein the atmosphere in which the preliminary heat treatment is conducted further comprises a hydrochloric acid gas.

4. A method for manufacturing a silicon carbide semiconductor device according to claim 2, wherein the atmosphere in which the preliminary heat treatment is conducted further comprises a hydrochloric acid gas.

5. A method for manufacturing a silicon carbide semiconductor device according to claim 3, wherein the hydrochloric acid gas is contained in an amount of not larger than 5% of hydrogen.

6. A method for manufacturing a silicon carbide semiconductor device according to claim 4, wherein the hydrochloric acid gas is contained in an amount of not larger than 5% of hydrogen.

7. A method for manufacturing a silicon carbide semiconductor device according to claim 1, wherein the preliminary heat treatment is conducted at a temperature in a range of 800 to 1200° C.

8. A method for manufacturing a silicon carbide semiconductor device according to claim 2, wherein the preliminary heat treatment is conducted at a temperature in a range of 800 to 1200° C.

9. A method for manufacturing a silicon carbide semiconductor device according to claim 7, wherein the silicon carbide substrate is annealed at least 1200° C. immediately after the preliminary heat treatment.

10. A method for manufacturing a silicon carbide semiconductor device according to claim 8, wherein the silicon carbide substrate is annealed at least 1200° C. immediately after the preliminary heat treatment.

11. A method for manufacturing a silicon carbide semiconductor device according to claim 7, further comprising the step of conducting prior heat treatment at a temperature in a range of 800 to 1200° C. before the preliminary heat treatment.

12. A method for manufacturing a silicon carbide semiconductor device according to claim 8, further comprising the step of conducting prior heat treatment at a temperature in a range of 800 to 1200° C. before the preliminary heat treatment.

13. A method for manufacturing a silicon carbide semiconductor device according to claim 1, wherein the preliminary heat treatment is conducted for at least five minutes.

14. A method for manufacturing a silicon carbide semiconductor device according to claim 2, wherein the preliminary heat treatment is conducted for at least five minutes.

15. A method for manufacturing a silicon carbide semiconductor device according to claim 1, wherein the preliminary heat treatment is conducted after an oxide film is removed.

16. A method for manufacturing a silicon carbide semiconductor device according to claim 2, wherein the preliminary heat treatment is conducted after an oxide film is removed.

17. A method for manufacturing a silicon carbide semiconductor device according to claim 1, wherein said silicon carbide substrate comprises one of 4H—SiC and 6H—SiC crystals.

18. A method for manufacturing a silicon carbide semiconductor device according to claim 2, wherein said silicon carbide substrate comprises one of 4H—SiC and 6H—SiC crystals.

* * * * *